United States Patent [19]

Diggle

[11] Patent Number: 4,820,975
[45] Date of Patent: Apr. 11, 1989

[54] TEST APPARATUS FOR PRINTED CIRCUIT BOARDS

[75] Inventor: Brian Diggle, Stalybridge, England

[73] Assignee: International Computers Limited, London, England

[21] Appl. No.: 138,864

[22] Filed: Dec. 29, 1987

[30] Foreign Application Priority Data

Jan. 14, 1987 [GB] United Kingdom ............... 8700754

[51] Int. Cl.$^4$ ........................................... G01R 15/12
[52] U.S. Cl. ............................... 324/158 F; 356/400; 324/158 P; 358/107
[58] Field of Search .......... 324/158 R, 158 F, 158 D, 324/73 R, 73 PC; 358/107; 356/399, 400, 401

[56] References Cited

U.S. PATENT DOCUMENTS

| | | | |
|---|---|---|---|
| 3,651,401 | 3/1972 | Cooney | 324/158 F |
| 3,970,934 | 7/1976 | Aksu | 324/158 P |
| 4,099,120 | 7/1978 | Aksu | 324/158 P |
| 4,357,575 | 11/1982 | Uren | 324/158 F |
| 4,556,903 | 12/1985 | Blitchington | 358/107 |
| 4,608,494 | 8/1986 | Kobayashi | 356/400 |
| 4,654,517 | 3/1987 | Reed | 356/400 |
| 4,696,047 | 9/1987 | Christian | 358/107 |

*Primary Examiner*—Michael J. Tokar
*Attorney, Agent, or Firm*—Lee & Smith

[57] ABSTRACT

Test apparatus is described for testing a printed circuit board (PCB). The apparatus includes two test heads, one for each side of the board. Each test head carries an array of spring loaded probes for making electrical contact with the pads on the PCB. Each head also includes two optical fiber image guides for viewing alignment marks at diagonally opposite corners of the PCB, so as to indicate the degree of misalignment between the head and the PCB. The alignment can be adjusted by means of linear drive mechanisms which allow the position of the head to be adjusted in two dimensions relative to the PCB.

9 Claims, 4 Drawing Sheets

TEST APPARATUS FOR PRINTED CIRCUIT BOARDS

This invention relates to apparatus for testing printed circuit boards (PCBs).

It is well known to test PCBs by means of a so-called bed-of-nails tester, comprising an array of spring-loaded probes, having the same pitch (i.e. grid spacing) as the conductive pads on the board to be tested. In operation, the probes of the tester are brought into contact with the pads on the board, and test signals are applied to the board by way of selected probes. Response signals from the board are picked up by the probes, and are output to a test circuit for comparison with the responses expected from a fault-free board.

In use of such a tester, it is necessary to ensure that the probes are accurately aligned with the pads on the board under test, so as to provide a good electrical contact between the probes and pads. This is usually achieved by means of alignment holes drilled in the board, which engage with dowel pins on the tester to ensure that the board is held in a predetermined position relative to the tester probes. However, a problem with this is that, during the various manufacturing steps, the board may expand and contract, leading to unpredictable variations in the relative positions of the contact pads and the alignment holes. As a result, when the board is positioned in the tester, the probes of the tester may not be accurately centred on the pads of the board and, moreover, the degree of misalignment may vary between one part of the board and another. This may lead to the board being rejected as untestable, which is clearly undesirable. This problem has been found to be particularly acute where the pitch of the pads and probes is of the order of 1 millimeter or less.

The object of the present invention is to provide a way of overcoming or reducing this problem.

SUMMARY OF THE INVENTION

According to one aspect of the invention there is provided test apparatus for testing a printed circuit board having at least one test head carrying an array of probes for contacting pads on the printed circuit board, the apparatus including: means for adjusting the position of the test head relative to the printed circuit board in two directions in a plane parallel to that of the printed circuit board; at least two spaced-apart optical fibre image guides, mounted in fixed relationship to the test head, for conveying images of two corresponding alignment marks on the printed circuit board; and means connected to each image guide for enabling the conveyed images to be utilised for aligning the test head with the printed circuit board.

The test apparatus in accordance with the invention thus allows the position of the test head to be adjusted relative to the board under test so as to give an optimum alignment between the probes and the pads. The adjustment may be made manually, by an operator observing the images. Alternatively, the adjustment may be made automatically, without the necessity for a human operator.

According to another aspect of the invention there is provided a method of testing a printed circuit board utilising test apparatus comprising at least one test head having an array of probes for contacting pads on the printed circuit board, the method comprising the steps of: providing at lest two alignment marks at spaced-apart positions on the printed circuit board; conveying images of the alignment marks along corresponding optical fibre image guides mounted in fixed relationship to the test head; and utilising the conveyed images to align the test head with the printed circuit board.

BRIEF DESCRIPTION OF THE DRAWINGS

One test apparatus in accordance with the invention will now be described by way of example with reference to the accompanying drawings.

DESCRIPTION OF AN EMBODIMENT OF THE INVENTION

Figure 1:
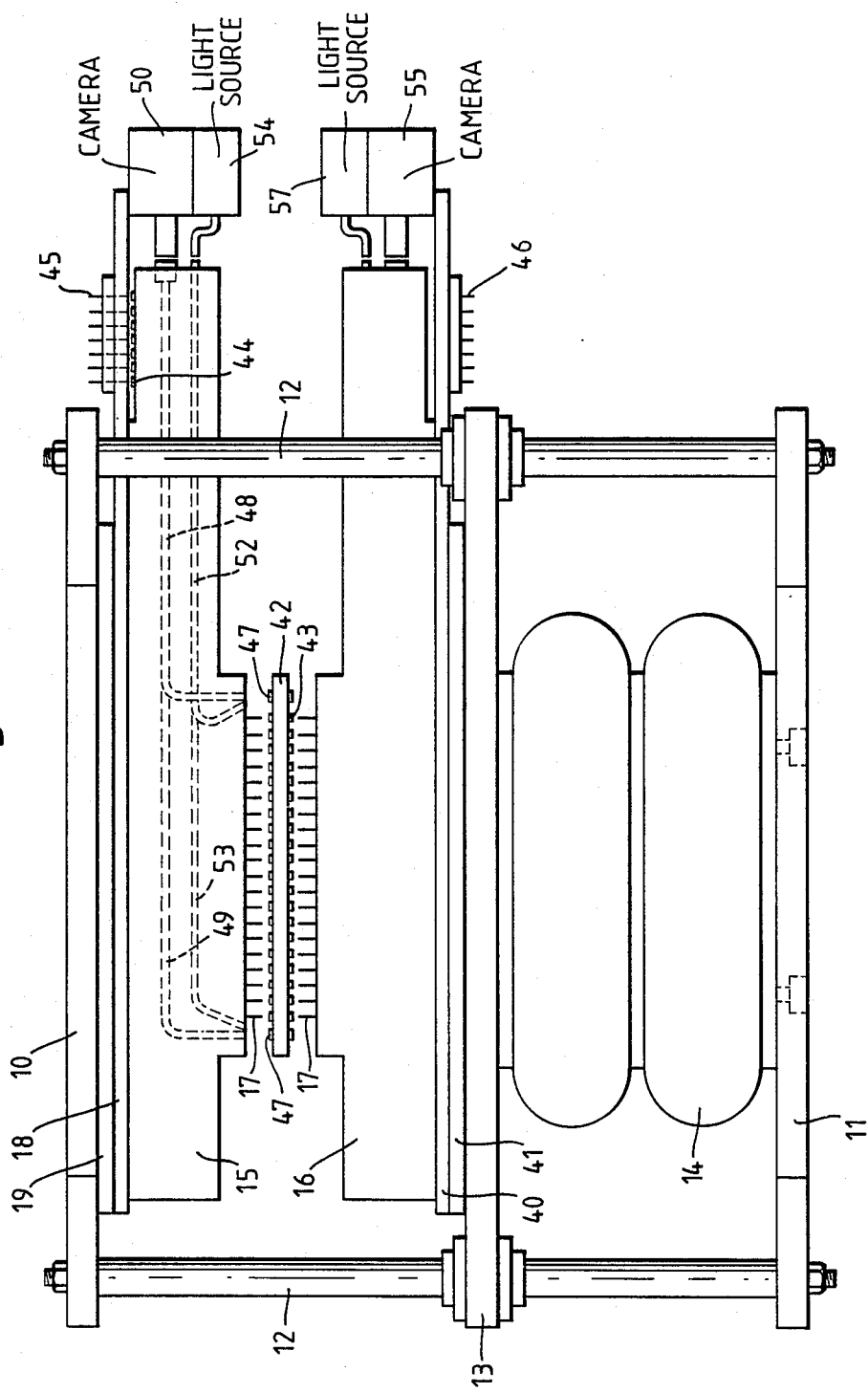
FIG. 1 is an elevational view of the apparatus.
Figure 2:
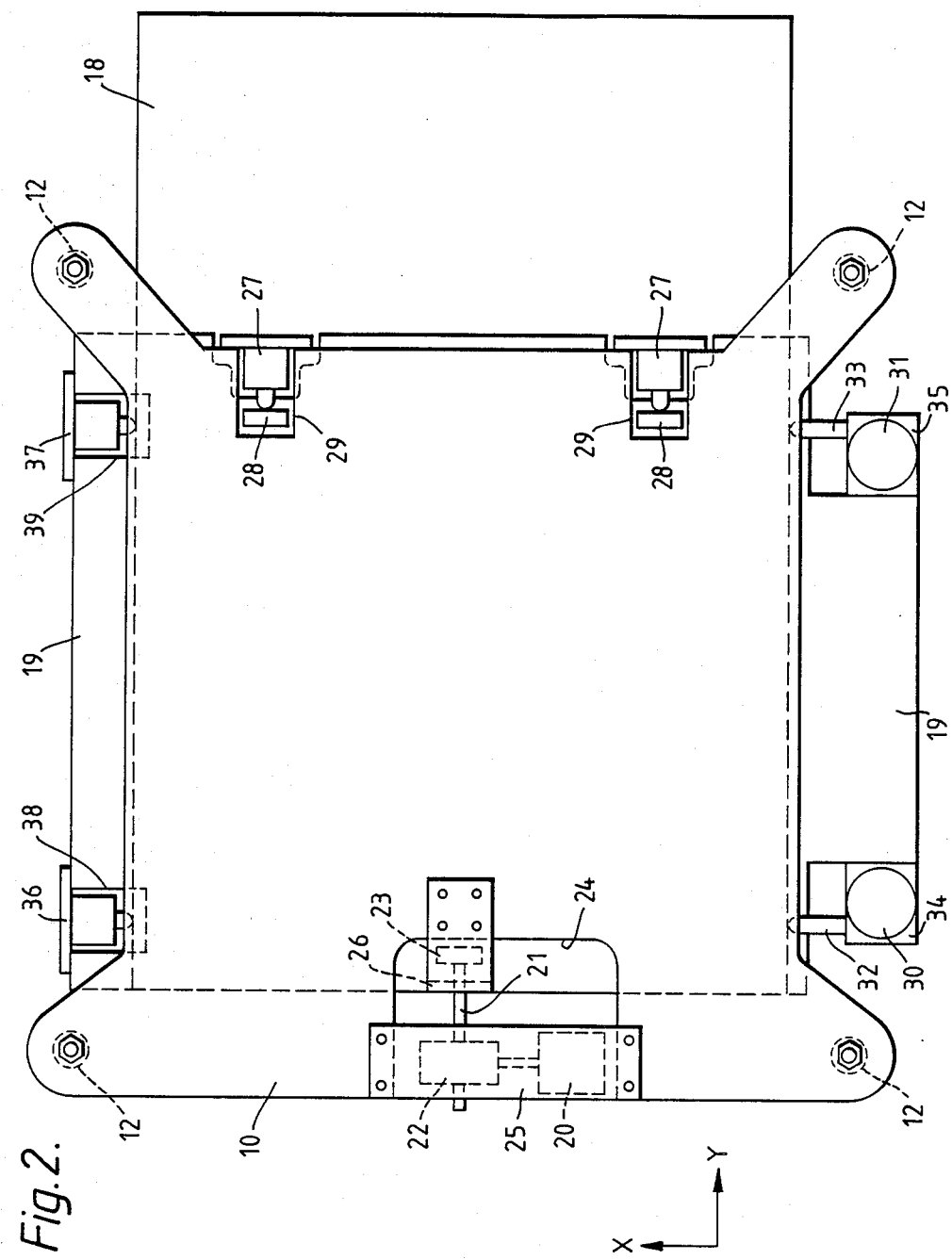
FIG. 2 is a plan view of the apparatus.

Referring to FIGS. 1 and 2, the test apparatus comprises a frame, consisting of two fixed plattens 10, 11 held in spaced relationship by means of four bars 12 of circular cross-section. A movable platten 13 is slidably mounted on the bars 12 between the two fixed plattens. A bellows 14 is connected between the movable platten 13 and the lower platten 11 so that by applying compressed air to the bellows the moveable platten 13 is urged upwards towards the upper platten 10.

The test apparatus includes two tes heads 15, 16, each of which includes an array fo spring-loaded probes 17 as in a conventional bed-of-nails tester. In the case of the upper test head 15, the probes 17 extend downwards, while in the case of the lower head 16 they extend upwards.

The upper test head 15 is removably mounted on a plate 18 referred to as the X-plate. The X-plate is mounted on a plate 19 referred to as the Y-plate, and this in turn is mounted on the upper fixed platen 10. The X-plate, Y-plate and upper platten are held together by means of bolts (not shown) passing through holes in the X and Y-plates, which allow the Y-plate to move by a limited amount relative to the fixed platten in a first direction Y, and allow the X-plate to move by a limited amount relative to the Y-plate in a second direction X, perpendicular to the first direction.

The Y-plate 19 can be moved in the Y direction relative to the fixed platten 10 by means of a stepper motor 20. This motor drives a push rod 21 by way of a gearbox 22. The end of the push rod 21 acts on a projection 23, fixed to the Y-plate. The motor 20 and gearbox 22 are located in a cut-out 24 in the platten 10, and are mounted on a support member 25 which bridges the cut out 24 and is secured to the platten 10. The push rod 21 is supported by a guide 26 which is also secured to the platten 10. The movement of the Y-plate in the Y direction is opposed by two pneumatic reaction cylinders 27 which act on projections 28 attached to the Y-plate. These cylinders 27 are attached to the fixed platten 10, being located within cut-out portions 29 of the platten.

The X-plate 18 can be moved in the X direction relative to the Y-plate 19 by means of a pair of stepper motors 30, 31 which drive push rods 32, 33 by way of gearboxes 34, 35. The motors 30, 31 and gearboxes 34, 35 are mounted on the Y-plate 19. The ends of the push rods 32, 33 act against the edge of the X-plate 18. The movement of the X-plate in the X direction is opposed by two pneumatic reaction cylinders 36, 37 which act on the opposite edge of the X-plate. These cylinders 36, 37 are attached to the Y-plate, being located within cut-out portions 38, 39 of the Y-plate.

In summary, it can be seen that the position of the X-plate 18 (and hence of the head 15 which is attached to the X-plate) can be adjusted in two dimensions in the X-Y plane by operation of the three stepper motors 20, 30 and 31. Moreover, by operating the stepper motors 30 and 31 by different amounts, the X-plate can also be rotated by a limited amount about an axis perpendicular to the X-Y plane.

The lower test head 16 is mounted on the movable platten 13, by means of an X-plate 40 and Y-plate 41 in a similar manner to the upper test head. The position of the lower test head 16 in the X-Y plane can be adjusted in a similar manner by means of three stepper motors (not shown).

The PCB to be tested 42 is clamped in a jig (not shown) between the two test heads 15, 16. It can be seen that by operating the bellows 14 the two test heads are urged into contact with opposite sides of the PCB 42, so that the probes 17 on the test heads make contact with conductive pads 43 on the two sides of the PCB.

The probes 17 in the upper test head 15 are connected (by means of wires not shown) to an array of contacts 44 on the upper face of the test head. When the test head 15 is mounted in position on the X-plate 18 as shown, these contacts 44 are engaged by an array of pins 45 fixed in the X-plate. The other ends of these pins 45 form a connector for providing external connection to a conventional test unit (not shown) for generating test signals and receiving response signals from the PCB under test. The probes in the lower test head 16 are similarly wired to pins 46 on the X-plate 40 for connection to the test unit.

The PCB under test 42 is also provided, on each of its two faces, with two extra pads 47 at diagonally opposite corners of the face. These pads are referred to herein as alignment marks and are used for aligning the test heads with the PCB as will be described.

Figure 3:
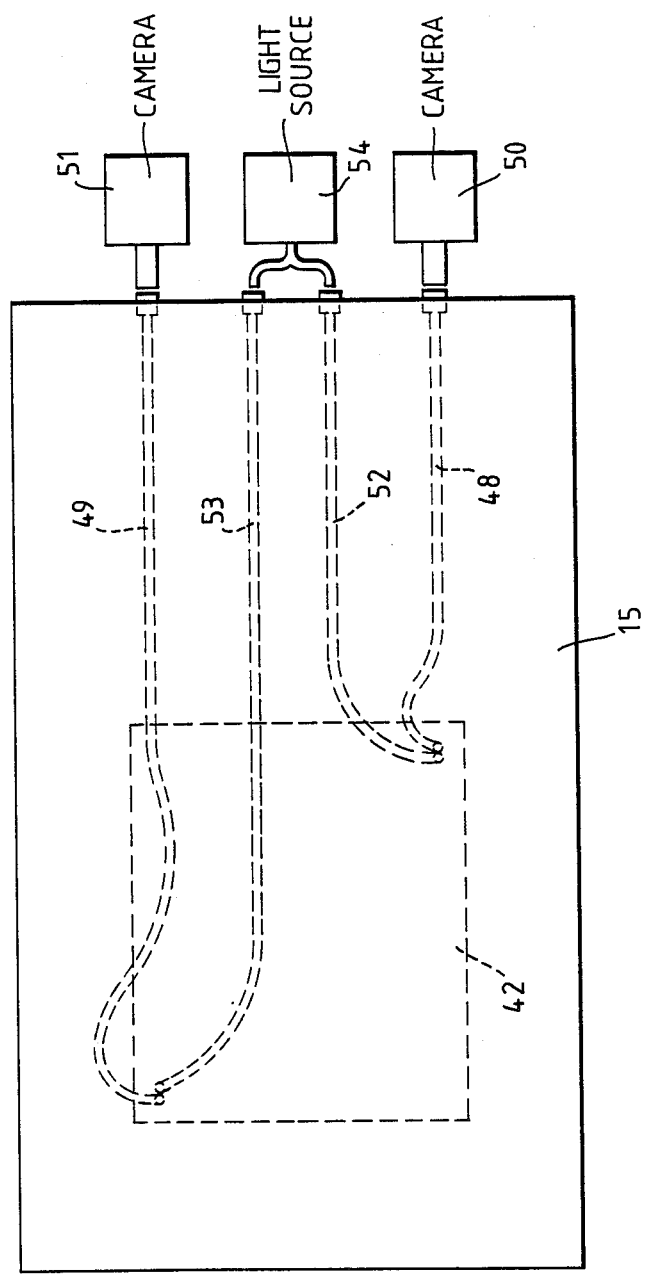
FIG. 3 is a plan view showing fibre optic connections within the test head.

Referring now to FIG. 3 as well as to FIG. 1, the upper test head 15 has two optical fibre image guides 48 and 49 embedded in it. Each of these guides consists of a coherent bundle of optical fibres, arranged to convey an image pattern falling on one end of the bundle to the other end. Such image guides are well known for use as endoscopes and so it is not necessary to describe the construction of these guides in detail.

The first ends of the image guides 48, 49 are positioned at diagonally opposite corners of the test head, adjacent to the two alignment marks 47 on the corresponding face of the PCB. Each of the image guides has an objective lens at this end, so as to form an image of the respective alignement mark. The other ends of the image guides engage with a pair of television cameras 50, 50. These cameras are standard CCD colour TV cameras, and are mounted on the X-plate 18.

Each of the image guides has a cross-hair graticule built into it. The positioning of the guides relative to the alignment marks 47 is such that, when the test head is correctly aligned with the PCB under test, the graticules will be centred on the alignment marks.

The test head 15 also has two optical fibre light guides 52, 53 embedded in it. These also consist of bundles of optical fibres, but they are not coherently arranged so that each bundle merely conveys light without preserving the image pattern. The first ends of the two light guides are positioned adjacent to the first ends of the image guides 48, 40. The other ends of the light guides are coupled to a light source 54, mounted on the X-plate 18. Thus, the light from the source 54 passes down the light guides 52, 53 to illuminate the surface of the PCB in the region of the alignment marks.

The lower test head 16 has a similar pair of image guides (not shown) coupled to a further pair of TV cameras 55, 56 and a pair of light guides, coupled to a light source 57.

Figure 4:
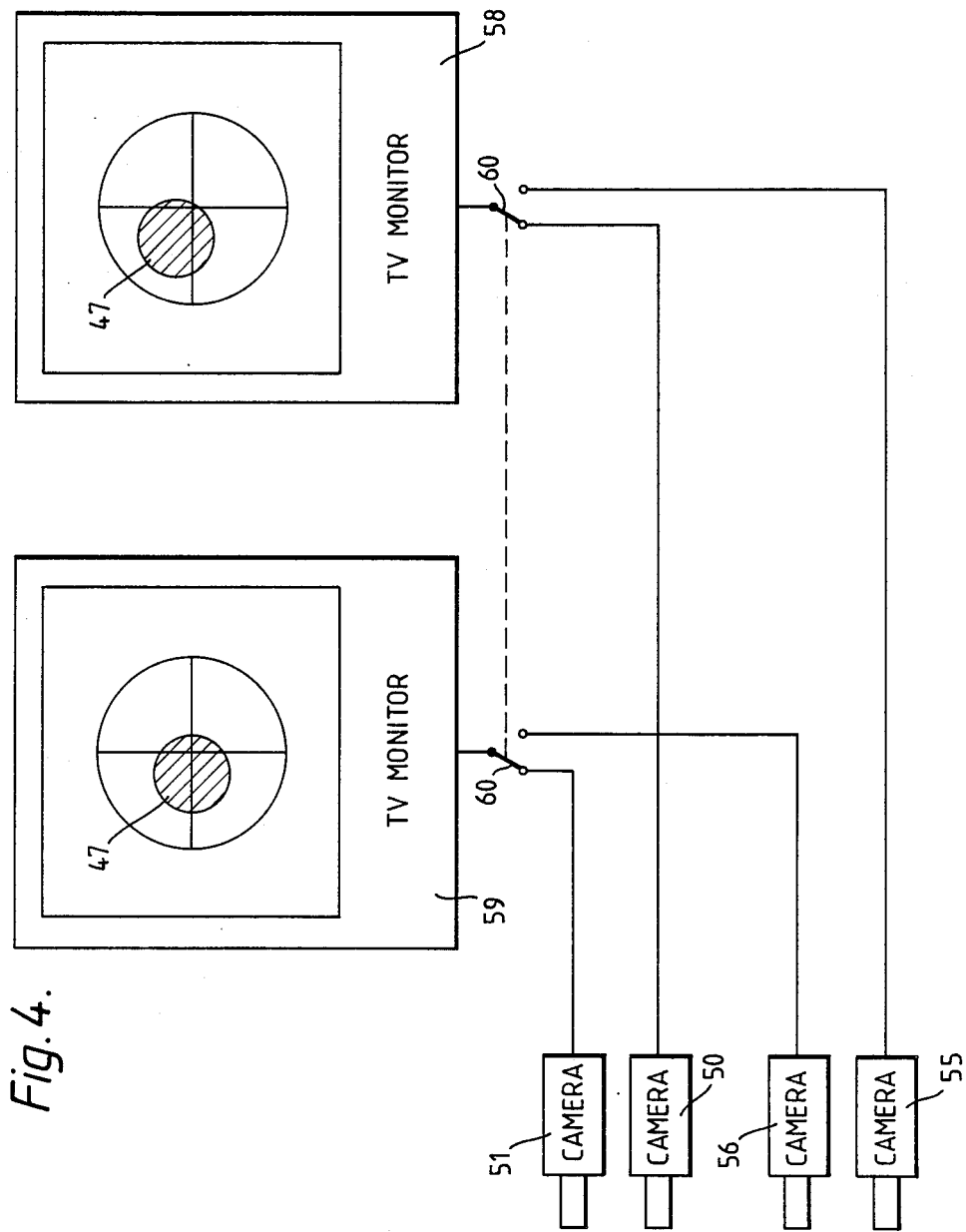
FIG. 4 is a circuit diagram showing connections between television cameras and monitor displays.

Referring now to FIG. 4, the apparatus also includes two colour TV monitors 58, 59, connected by means of a two-way switch to the four cameras 50, 52, 55, 56. When the switch 60 is in a first position, the monitors 58, 59 respectively receive the outputs from the two TV cameras 50, 51 for the upper test head. Conversely, when the switch 60 is in its other position, the monitors 58, 59 respectively receive the outputs from the two TV cameras 55, 56 for the lower test head.

The operation of the test apparatus will now be described.

First, the switch 60 is put in its first position, so as to select the outputs of the upper cameras 50, 51. The monitors 58, 59 will therefore display images of portions of the upper face of the PCB, in the regions of the two alignment marks 47. A typical display on each monitor is shown in FIG. 4. It can be seen that in each case the display includes the alignment mark 47, and the cross-hair graticule. Typically, neither alignment mark will be aligned with the graticule and, in general, both will be misaligned by different amounts.

The stepper motors 20, 30 and 31 of the upper test head are now operated, to move the upper test head relative to the PCB under test. In general, it will not be possible to align both marks exactly with the graticules, but it should be possible to improve the degree of alignments sufficiently to ensure that all the probes of the test head will make adequate electrical contact with their corresponding pads. For example, in the case illustrated on the monitor screens in FIG. 4, the stepper motor 20 would first be operated, so as to move the head in the Y-direction and hence to move both the images slightly to the right. The stepper motors 30, 31 would then be operated differentially so as to rotate the test head, so as to move the image on monitor 58 downwards.

The switch 60 is then put in its other position, and the above procedure is repeated so as to align the lower test head 16 with the alignment marks on the lower face of the PCB under test.

The bellows 14 is then operated so as to bring the probes on the test heads into contact with the two sides of the PCB, and the board is then tested in the conventional manner.

It should be noted that each of the test heads 15, 16 can be removed from the apparatus, and replaced by other test heads for testing different PCB designs. The cameras 50, 51, 55, 56 and the light sources 54, 57, however, remain attached to the respective X-plates 18, 40 when the test heads are removed.

In a possible modification of the apparatus described above, the colour TV cameras could be replaced by monochrome camers. However, it has been found preferable to use colour cameras, since they provide better discrimination between the copper pads which form the alignment marks and the colour of the PCB.

In another possible modification, the cameras may be connected to a computer which automatically analyses the images to determine the degree of misalignment and automatically controls the stepper motors so as to improve the alignment, without the need for a human operator.

I claim:

1. A method of testing a printed circuit board utilising test apparatus comprising at least one test head having an array of probes for contacting pads on the printed circuit board, the method comprising the steps of: providing at least two alignment marks at spaced-apart positions on the printed circuit board; simultaneously conveying images of the alignment marks along corresponding optical fibre image guides mounted in fixed relationship to the test head; and bringing both the conveyed images into alignment with associated fixed reference points.

2. Test apparatus for testing a printed circuit board, the apparatus having at least one test head carrying an array of probes for contacting pads on the printed circuit board, the apparatus including: at least two spaced-apart optical fibre image guides, mounted in fixed relationship to the test head, for simultaneously conveying images of two corresponding alignment marks on the printed circuit board; and means for adjusting the position of the test head relative to the printed circuit board in two directions in a plane parallel to that of the printed circuit board to enable the conveyed images to be brought into alignment with respective fixed reference points.

3. Apparatus according to claim 1 wherein said alignment marks are at diagonally opposite corners of the printed circuit board.

4. Apparatus according to claim 1 including a television camera connected to each image guide for converting the images conveyed by the image guide into electrical signals.

5. Apparatus according to claim 4 including a television monitor associated with each television camera and means for connecting said electrical signals to the respective monitors.

6. Apparatus according to claim 5 wherein each television monitor includes a fixed graticule for defining said fixed reference points.

7. Apparatus according to claim 4 wherein said television cameras are colour cameras.

8. Apparatus according to claim 1 including a light source and optical fibre light guides arranged to convey light from the light source to the surface of the printed circuit board in the vicinity of the alignment marks.

9. Apparatus according to claim 2 wherein said means for adjusting the position of the test head included a first linear drive means for moving the test head in a first direction, and two further linear drive means for moving the test head in a second direction perpendicular to the first direction and, by differential operation of the two further drive means, to rotate the test head about an axis perpendicular to the first and second directions.

* * * * *